United States Patent [19]
Yoshimizu

[11] Patent Number: 5,451,814
[45] Date of Patent: Sep. 19, 1995

[54] MULTI-CHIP MODULE INTEGRATED CIRCUIT

[75] Inventor: Toshikazu Yoshimizu, Suita, Japan

[73] Assignee: Mega Chips Corporation, Tokyo, Japan

[21] Appl. No.: 25,050

[22] Filed: Mar. 1, 1993

[30] Foreign Application Priority Data

Feb. 28, 1992 [JP] Japan .................... 4-079058

[51] Int. Cl.⁶ ............................... H01L 23/28
[52] U.S. Cl. .................. 257/685; 257/691; 257/723; 257/787
[58] Field of Search ........... 257/668, 676, 787, 723, 257/685, 691

[56] References Cited

FOREIGN PATENT DOCUMENTS 100761 5/1988 Japan .
163958 6/1992 Japan .

*Primary Examiner*—Rolf Hille
*Assistant Examiner*—Roy Potter
*Attorney, Agent, or Firm*—Frishauf, Holtz, Goodman & Woodward

[57] ABSTRACT

A multi-chip module semiconductor device including a plurality of IC chips arranged in a side-by-side relationship on a supporting member such as a tab is provided. Each of the IC chips is provided with an array of bonding pads for connection with the exterior of the device only along such side to which no other IC chip is disposed adjacent thereto.

9 Claims, 6 Drawing Sheets

Fig. 6

|  | MCM | Prior Art |
|---|---|---|
|  | A, B (two chips) | single chip |
| YIELD | Column of chip A / Column of chip B (wafer diagram) | (wafer diagram) |
| FUNCTION | 4M + 4M ⇒ 8M | DRAM<br>4M DRAM |
| FUNCTION | CPU + FPU<br>Function version-up | CPU, FPU<br>(Discrete) |
| FUNCTION | Multi-IC's per package<br>[4M][4M]<br>[CPU][FPU] | Single IC per package<br>[4MDRAM]<br>[CPU] [FPU] |

MULTI-CHIP MODULE INTEGRATED CIRCUIT

BACKGROUND OF THE INVENTION

1. Field of the Invention

This invention generally relates to a multi-chip module semiconductor device, and, in particular, to an arrangement of bonding pads on the chips of such a MCM semiconductor device.

2. Description of the Prior Art

A multi-chip module (MCM) semiconductor device is well known in the art and it includes a plurality of bare semiconductor integrated circuit chips, which are not individually packaged, but packaged in a common package. Such MCM semiconductor devices may be generally categorized into two types, i.e., (1) ceramic package type and (2) plastic package type.

The ceramic package type is used where heat production and high reliability are primary concerns, such as a CPU board for use in a work station, wherein all of LSI's are contained in the same package so as to obtain an increased speed by reducing the propagation delay of a signal, and MCM semiconductor devices for use in automobiles. On the other hand, the plastic package type is used where heat production and high reliability are not primary concerns so as to attain an increased yield, a reduction in the overall cost, an upgraded function due to integration of a plurality of functions, etc.

Now, merits of such MCM devices will be described with reference to a table illustrated in FIG. 6, which illustrates merits of MCM devices in comparison with a conventional single chip semiconductor device.

First, regarding yield, the conventional single chip approach is disadvantageous because the chip size tends to become larger should the same function as that of a MCM device be provided by a single chip device. Described more in detail, as shown in FIG. 6, in the case of the conventional single chip approach, even if a single defect is present in the chip as indicated by "X", the chip as a whole becomes defective. On the other hand, in the case of the MCM approach, even if one or more defects are present, as long as a chip A, which corresponds to the left-hand half section of the conventional single chip, is a good chip (as indicated by circles in FIG. 6), it can be combined with another good chip B, which corresponds to the right-hand half section of the conventional single chip, thereby providing an operative complete device. Thus, the MCM approach allows to obtain an increased yield.

FIG. 3 is a graph illustrating a relationship between the chip size and the yield. It can be seen from FIG. 3 that the smaller the chip area, the higher the yield and the lower the chip cost. On the other hand, since an increase in the assembly cost as the chip area becomes smaller is rather small, the total cost continues to decrease until it levels off by advancing the degree of multi-chip approach. Accordingly, as specifically illustrated in FIG. 3, in the case of manufacturing 16M DRAMs, it can be understood that the total cost can be significantly reduced by combining smaller capacity DRAM chips, such as 8M and 5.3M DRAMs, into a 16M DRAM rather than manufacturing a 16M DRAM as a single chip. Besides, in the case of a MPU, the total cost can be significantly reduced similarly by adopting the multi-chip approach rather than providing all of CPU, FPU, cache memory and the like on a single chip.

Regarding a functional aspect, in the conventional device, since only a single IC can be contained in a single package, only a single function can be provided per package. On the other hand, in the case of the MCM approach, since a plurality of ICs can be provided in the same package, a variety of semiconductor devices having a multiplicity of functions and/or an upgraded function can be provided. For example, there can be provided a 8M bit/package DRAM by using two 4M DRAMs, and a semiconductor device including a CPU and a FPU contained in the same package can be manufactured without changing the process rules.

However, in accordance with the conventional MCM approach, in particular in the case of plastic sealed MCM approach, when sealing a chip mounted on a tab with a resin, the arrangement of tabs and leads needs some considerations as shown in FIG. 4. In the specific arrangement of tabs and leads shown in FIG. 4, difficulty may be encountered in determining a layout because of increased constraints in providing leads in an area sandwiched between the two adjacent tabs. Because of such constraints, the resulting package tends to become larger. In the specific structure shown in FIG. 4, a chip 57 is directly mounted on a tab 52 and a plurality of leads 55 are wire-bonded to the chip 57 by bonding wire 61. All of the chips 57 are commonly sealed in a resin package 56.

FIGS. 5a and 5b illustrate a prior art approach trying to reduce the constraints in the arrangement of leads as described above. However, this prior art approach increases complication in the shape of lead pattern, which, in turn, causes the wire bonding to be difficult to implement. In the structure shown in FIGS. 5a and 5b, a chip 117 is directly mounted on a corresponding tab 112 and a tab connector 113 connects the two tabs 112 together. Leads 115 are arranged around each of the tabs 112 and connected to corresponding chips 117 by bonding wire 121. All of these elements are sealed in a common resin package 116.

SUMMARY OF THE INVENTION

In accordance with the present invention, there is provided a multi-chip module semiconductor device which comprises a support member, a plurality of bare IC chips mounted on the support member, a plurality of leads arranged around the support member and electrically connected to corresponding ones of the IC chips through bond wire and a common package which seals all of the plurality of bare IC chips commonly, wherein each of the IC chips is provided with bonding pads for connection with selected ones of the leads for communication of signals with the exterior of the chips arranged along each of its sides where no other chip is disposed adjacent thereto.

As described above, in accordance with the present invention, since those pads to be used for communication of signals with the exterior of the device are arranged only along those sides where no other chip is disposed adjacent thereto, it is not necessary to connect all of the bonding pads of each of the IC chips to the leads. Thus, when arranging a plurality of IC chips on the same tab of a leadframe for packaging with the same resin, there will be no constraints in the arrangement of tabs and the package is prevented from becoming larger.

It is therefor a primary object of the present invention to provide an improved multi-chip module packaging technology.

Another object of the present invention is to provide an improved multi-chip module semiconductor device free of constraints in determining the layout of tabs.

A further object of the present invention is to provide an improved multi-chip module semiconductor device which allows to establish an electrical connection with the exterior as easy as the conventional single chip module semiconductor device.

A still further object of the present invention is to provide an improved multi-chip module semiconductor device compact in size.

Other objects, advantages and novel features of the present invention will become apparent from the following detailed description of the invention when considered in conjunction with the accompanying drawings.

BRIEF DESCRIPTION OF THE DRAWINGS

FIG. 5b is a schematic illustration showing a cross section of the structure shown in FIG. 5a taken along line A—A indicated in FIG. 5a; and FIG. 6 is a table showing a comparison between the single chip and multi-chip module semiconductor devices.

DESCRIPTION OF THE PREFERRED EMBODIMENTS

Figure 1A:
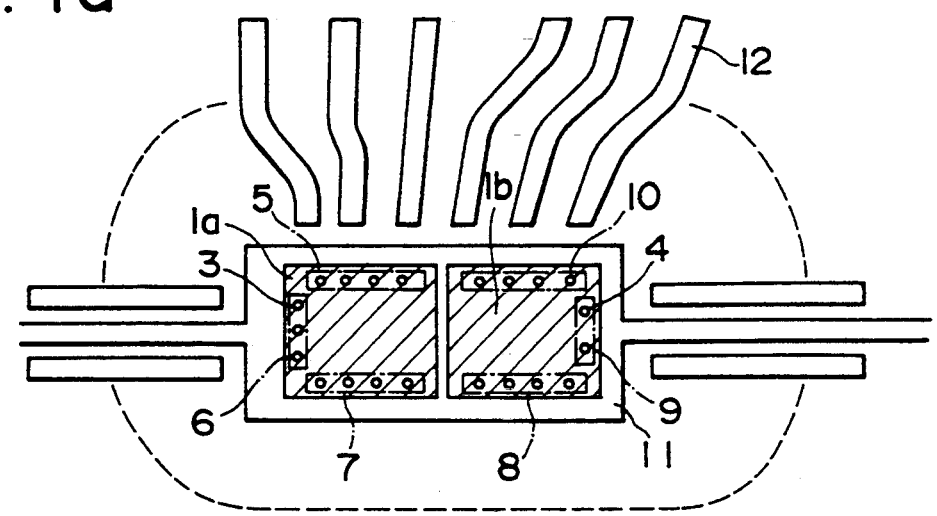
FIG. 1a is a schematic illustration showing in plan view a structure of a multi-chip module semiconductor device prior to the step of resin sealing in accordance with one embodiment of the present invention.

Referring now to FIG. 1a, there is schematically shown a multi-chip module semiconductor device constructed in accordance with one embodiment of the present invention. As shown, this device includes two discrete integrated circuit (IC) chips 3 and 4 which are directly mounted on a tab 11 of a leadframe serving as a support member. In the illustrated embodiment, each of the two chips 1a and 1b is rectangular in shape and thus has four sides. For example, chip 1a has one side which is adjacent to one side of chip 1b and remaining three sides 5, 6 and 7 which are free of any other adjacent chip. Similarly, chip 1b has remaining three sides 8, 9 and 10 which are free of any other adjacent chip. The chip 1a is provided with an array of bonding pads 3 for communication of signals with the exterior of the device along each of the free sides 5, 6 and 7. Likewise, the chip 1b is provided with an array of bonding pads 4 for communication of signals with the exterior of the device along each of the free sides 8, 9 and 10. A plurality of leads 12 are arranged around the tab extending generally radially.

Figure 4:
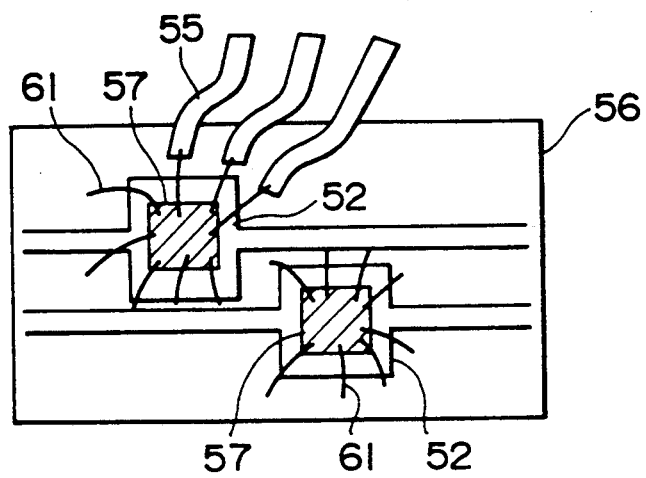
FIG. 4 is a schematic illustration showing in plan view the structure of one example of conventional resin sealed multi-chip module semiconductor device prior to the step of resin sealing.
Figure 5A:
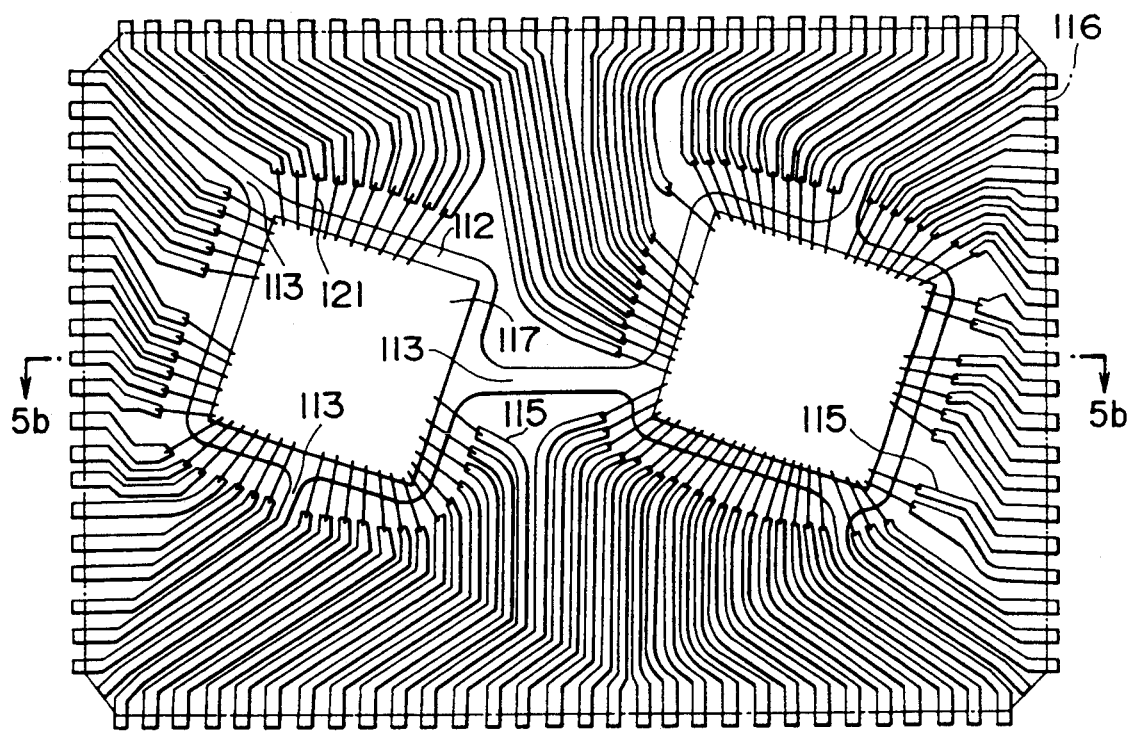
FIG. 5a is a schematic illustration showing in plan view the structure of another example of conventional resin sealed multi-chip module semiconductor device prior to the step of resin sealing.
Figure 5B:
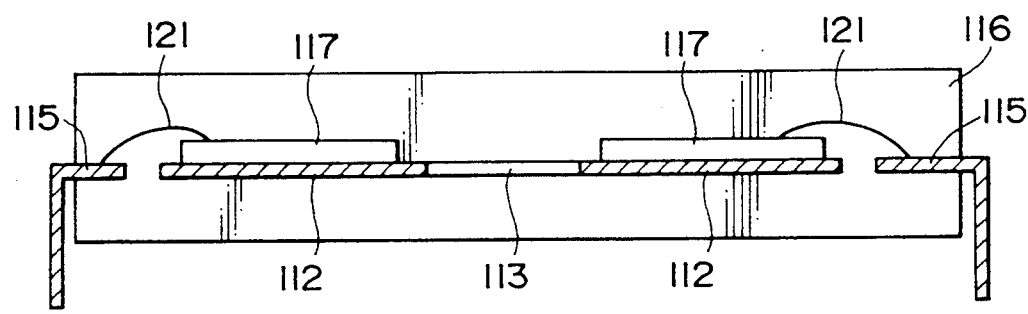

With the structure shown in FIG. 1a, since the bonding pads 3 and 4 for use in communication signals with the exterior of the device are provided in the chips 1a and 1b only along the sides of these chips 1a and 1b where no other chip is disposed adjacent thereto, these chips 1a and 1b can be directly mounted on the tab 11 located adjacent to each other and sealed by a resin. Accordingly, there will be produced no constraints in the layout of tabs as different from the conventional multi-chip module approach shown in FIG. 4 and in addition it is not necessary to use leads of complicated shape as shown in FIG. 5 for connection with the exterior. With the structure shown in FIG. 1a, use may be made of ordinary leads, which are commonly used in single chip devices, for connection with the exterior. Thus, no particular difficulty will be encountered in implementing wire bonding even if the degree of multi-chip structure is advanced. Besides, the size of the overall structure can be minimized in this embodiment.

Figure 1B:
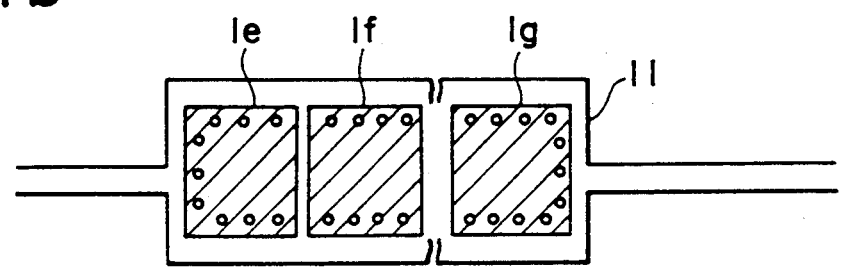
FIG. 1b is a schematic illustration showing in plan view a structure of a multi-chip module semiconductor device prior to the step of resin sealing in accordance with another embodiment of the present invention.

FIG. 1b illustrates a multi-chip module semiconductor device constructed in accordance with another embodiment of the present invention, and this device includes three integrated circuit chips 1e, 1f and 1g which are arranged in a line to define a combined device. In this embodiment also, an array of bonding pads for communication signals with the exterior of the device is provided along each side of each of the IC chips 1e, 1f and 1g where there is disposed no other IC chip adjacent thereto. For example, since the left-hand chip 1e has three free sides excepting the right-hand side, adjacent to which the center chip 1f is disposed, an array of bonding pads for use in communicating signals with the exterior of the device is provided along each of the three free sides. Similarly, since the right-hand chip 1g has three free sides excepting the left-hand side, adjacent to which the center chip if is disposed, an array of bonding pads for use in communicating signals with the exterior of the device is provided along each of the three free sides. On the other hand, since the center chip 1f is sandwiched between the two left-hand and right-hand chips 1e and 1g, it has only two top and bottom sides along each of which an array of bonding pads for use in communicating signals with the exterior is provided.

In the structure shown in FIG. 1b, there are shown only three IC chips 1e, 1f and 1g arranged in a line; however, four or more such IC chips can also be provided on a common tab arranged in a line, if desired.

Figure 1C:
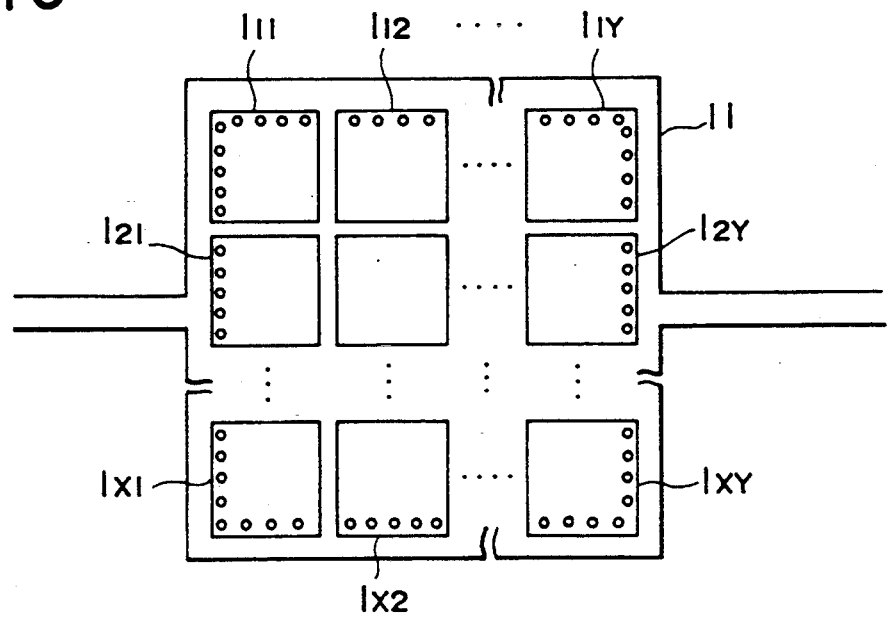
FIG. 1c is a schematic illustration showing in plan view a structure of a multi-chip module semiconductor device prior to the step of resin sealing in accordance with a further embodiment of the present invention.

FIG. 1c illustrated a multi-chip module semiconductor device constructed in accordance with a further embodiment of the present invention. In this embodiment, there is provided a tab 11 having a relatively broad surface, on which a plurality of IC chips $1_{11}$ through $1_{XY}$ are arranged in the form of a two-dimensional matrix. In the present embodiment, since the IC chips are arranged in the form of a two-dimensional matrix, each of the four corner IC chips $1_{11}$, $1_{X1}$, $1_{Y1}$ and $1_{XY}$ has two free sides, along each of which an array of bonding pads for use in communication of signals with the exterior of the device is provided, and each of the peripheral ICs located at the periphery of the matrix excepting those at the four corners has a single free side along which an array of bonding pads for use in communication of signals with the exterior of the device.

In the arrangement shown in FIG. 1c, those IC chips having four sides, each of which is located adjacent to another IC chip, are not provided with bonding pads for use in communication of signals with the exterior of the device. Thus, in the structure shown in FIG. 1c, only the outer or peripheral IC chips have bonding pads for use in communication with signals with the exterior and the inner IC chips having no free sides are not provided with bonding pads for use in communication with the exterior of the device.

Figure 2A:
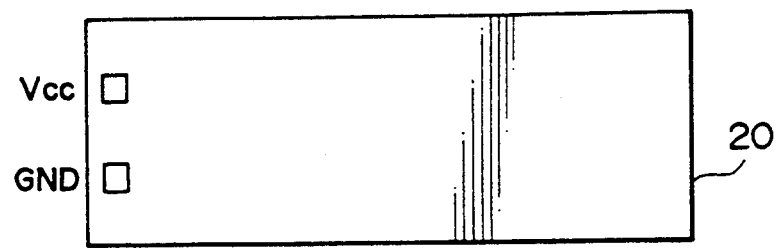
FIG. 2a is a schematic illustration useful for explaining how a chip-to-chip connection is established between two adjacent chips in the multi-chip module environment in accordance with the present invention.

As described above, in accordance with the present invention, bonding pads for external communication, i.e., communication of signals with the exterior of the device, are provided along each of the free sides of an IC chip, adjacent to which no other IC chip is disposed. Each of the IC chips is also provided with bonding pads for internal communication or chip-to-chip communication, which are arranged along each of its sides, adjacent to which another IC chip is disposed. FIG. 2a illustrates one such example in which two bonding pads, i.e., Vcc and GND bonding pads, are provided along the left-hand side of an IC chip 20, adjacent to which another IC chip (not shown) is disposed. Although not shown specifically in FIG. 2a, it should be understood that an array of bonding pads for external communication is provided along each of the top, bottom and right-hand sides.

Figure 2B:
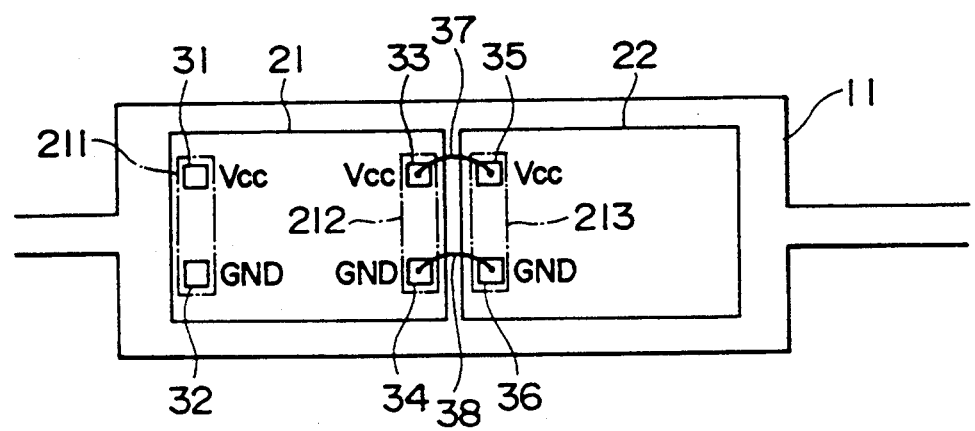
FIG. 2b is a schematic illustration showing in plan view a chip-to-chip connection established between two adjacent chips in a multi-chip module semiconductor device for power supply and ground bonding pads in accordance with one embodiment of the present invention.

Alternatively, if the device shown in FIG. 2a is single 8M DRAM, it can be substituted by a multi-chip module structure comprised of two 4M DRAMs as shown in FIG. 2b. In the multi-chip module structure including two IC chips 21 and 22 shown in FIG. 2b, the chip 21 has a side 212 which is adjacent to a side 213 of the other chip 22, and the chip 21 is provided with power supply (Vcc) and ground (GND) bonding pads 33 and 34 along the side 212 and the chip 22 is provided with power supply and ground bonding pads 35 and 36 along the side 213 in an opposed relationship. The power supply bonding pads 33 and 35 are connected by bonding wire 37 and similarly the ground bonding pads 34 and 36 are connected by bonding wire 38. Thus, the bonding pads 33–36 are used for internal or chip-to-chip communication.

As also shown in FIG. 2b, the chip 21 is also provided with another set of power supply and ground bonding pads 31 and 32 along its left-hand side 211, but these bonding pads 31 and 32 are used for external connection so that they are connected to external power supply and ground terminals outside of the device. Thus, the power supply voltage Vcc and ground voltage GND are applied to the chip 22 via the chip 21 in the structure shown in FIG. 2b. It can be understood that wiring can be extremely simplified with the application of the present invention.

Figure 2C:
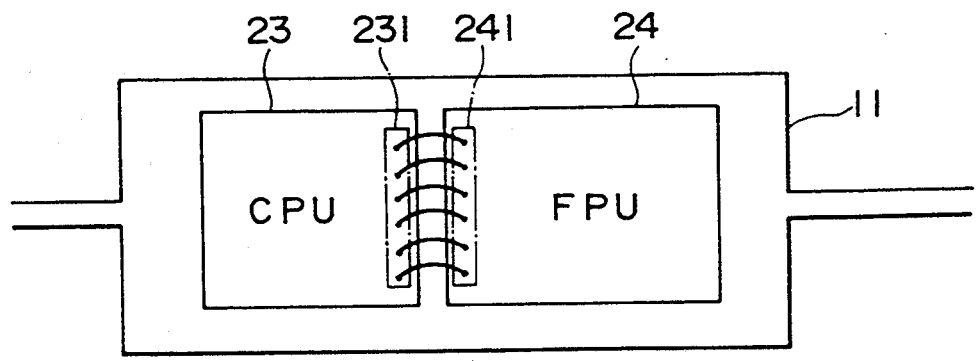
FIG. 2c is a schematic illustration showing in plan view a chip-to-chip connection established between a CPU and a FPU which are adjacent to each other in a multi-chip module semiconductor device for communication signals therebetween.
Figure 3:
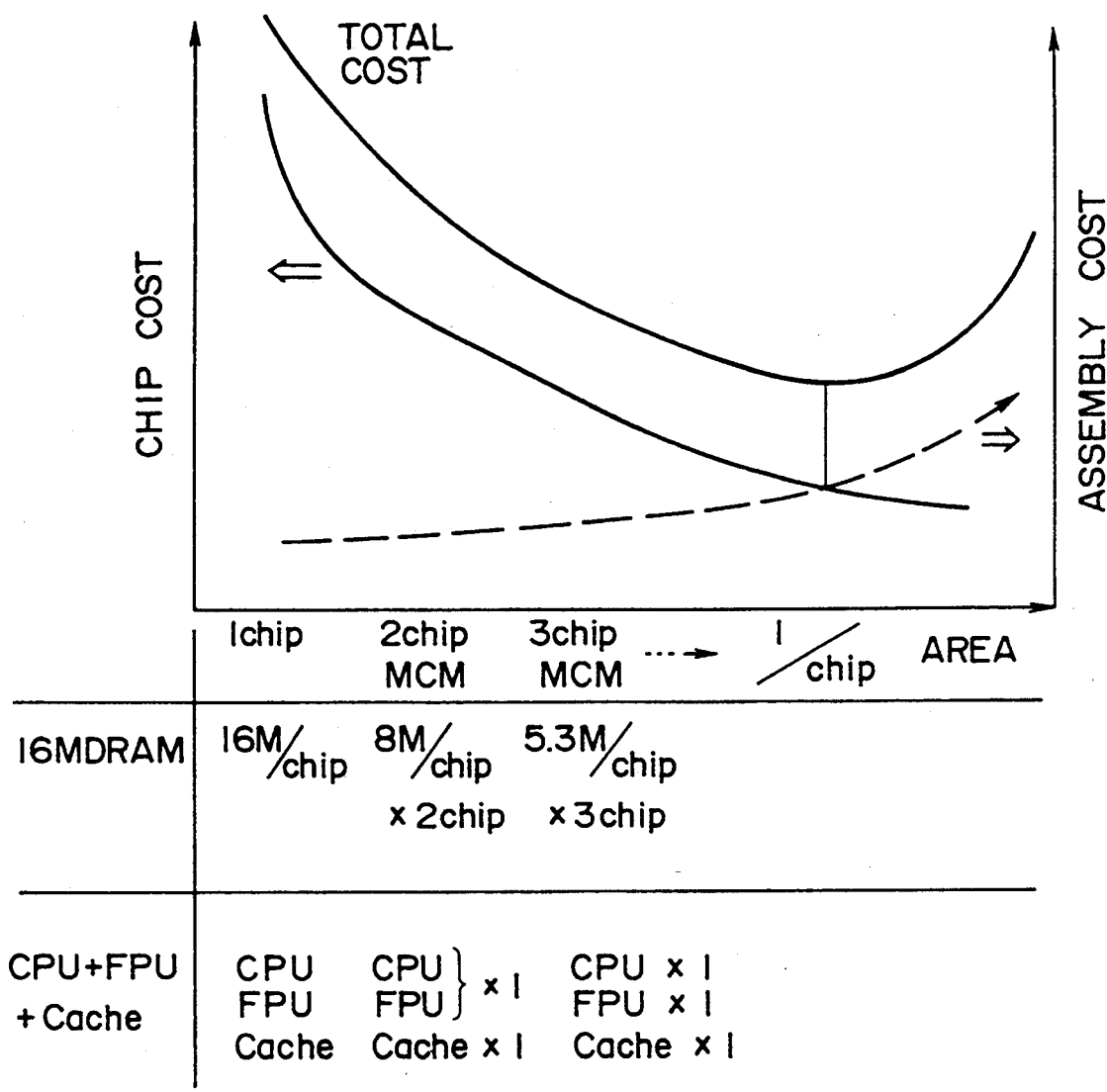
FIG. 3 is a graph showing a relationship between the chip size and the yield in manufacturing integrated circuit semiconductor chips.

FIG. 2c illustrates another embodiment in which a CPU chip 23 and a FPU chip 24 are arranged in a side-by-side relationship. Thus, the CPU chip 23 has a right-hand side 231 which is adjacent to a left-hand side 241 of FPU chip 24. An array of bonding pads for internal communication is provided along each of the sides 231 and 241 adjacent to each other and the corresponding bonding pads of the respective chips are connected by bond wire for internal communication. In this structure, a bonding pad for use in internal communication or chip-to-chip communication is not provided along any of the sides other than 231 and 241, and a bonding pad for use in external communication or communication with the exterior of the device can be provided along any one or more of the remaining three free sides of each of CPU and FPU chips 23 and 24.

In the above-described embodiments, the IC chips are directly mounted on a tab serving as a support member and sealed with a resin. However, the present invention should not be limited only to such particular applications. The present invention can also be applied to a ceramic package type MCM semiconductor device, in which a plurality of IC chips are mounted on a base substrate and its sub-assembly is placed in a cavity defined by a ceramic material.

As described above, in accordance with the present invention, since a multi-chip module semiconductor device is so structured that bonding pads for use in communication with the exterior are arranged only along a free side of an IC chip where no other IC chip is located adjacent thereto, a connection between the device and the exterior can be established extremely easily without much difference from the prior art single module semiconductor device and the overall package can be minimized in size.

While the above provides a full and complete disclosure of the preferred embodiments of the present invention, various modifications, alternate constructions and equivalents amy be employed without departing from the true spirit and scope of the invention. Therefore, the above description and illustration should not be construed as limiting the scope of the invention, which is defined by the appended claims.

What is claimed is:

1. A multi-chip module semiconductor device, comprising:
   a support member;
   a plurality of bare IC chips mounted on said support member;
   a plurality of leads arranged around said support member and electrically connected to corresponding ones of said IC chips through bond wire; and
   a packaging material which seals all of the plurality of bare IC chips commonly,
   wherein said plurality of bare IC Chips includes:
   a first IC chip having first and second power supply pads and first and second ground pads, said first power supply pad and said first ground pad being disposed along a first side of said first IC chip, and said second power supply pad and said second ground pad being disposed along a second side of said first IC chip different from said first side, said first and second power supply pads being electrically connected to each other internally through said first IC chip, and said first and second ground pads being electrically connected to each other internally through said first IC chip; and a second IC chip having only a single power supply pad and a single ground pad along one side of said second IC chip, which side is adjacent to said second side of said first IC chip, said single power supply pad of said second IC chip being wire-bonded to said second power supply pad of said first IC chip, and said single ground pad of said second IC chip being wire-bonded to said second ground pad of said first IC chip.

2. The device of claim 1, wherein said support member is a tab of a leadframe.

3. The device of claim 1, wherein each of said plurality of IC chips has at least one side which is adjacent to a side of another of said IC chips and along which at least one bonding pad for chip-to-chip connection is provided.

4. The device of claim 3, wherein said chip-to-chip connection is established by bonding wire.

5. The device of claim 1, wherein said plurality of IC chips are arranged in a line.

6. The device of claim 1, wherein said plurality of IC chips are arranged in the form of a two-dimensional matrix.

7. The device of claim 1, wherein said first and second IC chips are DRAM chips.

8. The device of claim 1, wherein said first IC chip includes a CPU chip and said second IC chip includes a FPU chip.

9. The device of claim 1, wherein said packaging material is a resin.

* * * * *